United States Patent [19]

Nozaki

[11] 4,384,348

[45] May 17, 1983

[54] METHOD FOR TESTING SEMICONDUCTOR MEMORY DEVICE

[75] Inventor: Shigeki Nozaki, Kawasaki, Japan

[73] Assignee: Fujitsu Limited, Kawasaki, Japan

[21] Appl. No.: 221,329

[22] Filed: Dec. 29, 1980

[30] Foreign Application Priority Data

Dec. 27, 1979 [JP] Japan .................. 54-182455[U]

[51] Int. Cl.³ ............................................. G11C 13/00
[52] U.S. Cl. ....................................... 365/201; 371/21
[58] Field of Search ............... 365/174, 189, 230, 201; 371/21

[56] References Cited

U.S. PATENT DOCUMENTS

4,183,096  1/1980  Cenker ................................. 365/222

Primary Examiner—Terrell W. Fears
Attorney, Agent, or Firm—Staas & Halsey

[57] ABSTRACT

A semiconductor memory testing device and testing method comprises an address pattern generator which successively generates an address pattern which specifies the X-Y addresses of each memory cell of a semiconductor memory device which is to be tested, an address changeover or swapping device which makes access to the semiconductor memory device with the address pattern supplied by the address pattern generator during normal operation mode, and addresses interchanged during swap operation mode, a comparator which compares data from the semiconductor memory device with an expected value to detect hardware error, and a fail memory device which stores information concerning the existence hardware error in each of the memory cells of the semiconductor memory device in an address region corresponding to that of the bad cell of the semiconductor memory device. The semiconductor memory device and the fail memory device both receive common X-Y addresses from the address changeover or swapping device. The comparator preheated from comparing by a signal supplied from said fail memory device for the memory cells of the semiconductor memory device corresponding to the memory cells of the fail memory device which have information stored therein indicating the existence of hardware errors.

8 Claims, 7 Drawing Figures

METHOD FOR TESTING SEMICONDUCTOR MEMORY DEVICE

BACKGROUND OF THE INVENTION

The present invention generally relates to methods and devices for testing semiconductor memory devices, and more particularly to a semiconductor memory testing device and testing method which allows testing of a semiconductor memory device to be performed in a swap mode, that is, in a mode in which X and Y addresses of the semiconductor memory device are interchanged.

In semiconductor memory devices such as a ROM (Read Only Memory) or a RAM (Random Access Memory), storage cells are arranged in an X-Y matrix form, and a desired storage cell is selected by specifying the X-address and Y-address. However, when the capacity of a semiconductor memory device of the above type is increased as in an LSI (Large Scale Integrated) circuit, the probability of hardware errors being introduced during the manufacturing stage into the storage cells of one or more bits, becomes high.

Conventionally, a method was proposed in which redundancy bits are provided to replace the defective bits having hardware errors, to decrease the percentage of the defective bits within the memory device. Another method proposed is a method in which error correcting codes are used to compensate for the defective bits within the system. Hence, defects in some bits of the memory device does not make the whole memory device (chip) defective. However, there is a problem. The problem is that, the memory device which is ready for use is tested before it is built into a system, but when a defective bit exists in the memory device, the margin characteristic of the memory device cannot be determined, and the testing of the memory device is interrupted.

In order to overcome the above described problems, still another method was proposed which stores the address of the defective bit into another memory (fail memory) device, so that when access is made to the defective bit, this access is prohibited by the output signal supplied from the above fail memory device, and masking of the memory device is performed during the operational testing. That is, if a defective bit exists at a certain address of a RAM device, for example, an information to indicate that the bit at this certain address is defective, is written-into a fail memory device at the same address location as that of the above certain address. Hence, upon operational testing of this RAM device, access is made to the fail memory device together with the RAM device, and, according to the information stored in the fail memory device, prohibits the operational testing of the defective bit within the RAM device is prohibited. Accordingly, the RAM device can be tested as if no defective bits existed even when defective bits exist in that RAM device, and, the RAM device tested can be treated as being fully operational, when there are no other defective parts within the RAM device.

The operational testing is also performed under a swap mode in which the X and Y addresses of the memory device are interchanged, in contrast to a normal mode in which access to the bits of the memory device are made in the order the address is specified. This testing under the swap mode is sometimes necessary, since some of the characteristics of a memory device depend on the address patterns. For example, there often are cases in which the defective bits are concentrated in certain columns (Y-side) or rows (X-side), within the memory device. In this case, the whereabouts of the defects can be easily found, when the X and Y addresses are interchanged and scanning is performed along the column or row having concentrated defective bits therein. Furthermore, there are many types of testing systems, mainly, galloping system, walking system, and like, and the address swapping is required to perform these types of tests.

Generally, when the addresses of the bits in the memory device are specified by a 12-bit signal $(A_0 \sim A_{11})$, the lower six bits $(A_0 \sim A_5)$ of the above 12-bit signal generated by an address pattern generator is selected as the X-address, and the higher six bits $(A_6 \sim A_{11})$ as the Y-address. Therefore, when a defective bit exists at the X-address $(A_0 \sim A_5)$ "010000" and Y-address $(A_6 \sim A_{11})$ "001000" in a normal mode, for example, the address of the defective bit in the swap mode in this case becomes "010000" for the XX-address $(A_6 \sim A_{11})$ "001000" for the YY-address $(A_0 \sim A_5)$ since the address pattern generator maintains the same output as that upon normal mode, where XX and YY respectively designate the X and Y addresses in the swap mode. However, this address changeover is conventionally only performed for the memory device (usually a RAM device) and not for the fail memory device. Accordingly, the address upon normal mode is always set in the fail memory device, that is, "010000" for the X-address $(A_0 \sim A_5)$ and "001000" for the Y-address, $(A_6 \sim A_{11})$ in the case of normal mode. But upon swap mode, when XX-address is "010000" and YY-address is "001000", the address in the fail memory device is set as being "001000" for the X-address and "010000" for the Y-address. This result does not correspond to the original address of the defective bit in the memory device, and hence the defective bit cannot be masked.

Therefore, in the conventional method, for example, the information stored in the fail memory device upon normal mode is erased and new information is stored into the fail memory device upon swap mode, to enable the masking of the defective bits. However, this operation of storing information into the fail memory device twice, complicates the testing method, and suffers disadvantages in that the required operation time is increased.

SUMMARY OF THE INVENTION

Accordingly, a general object of the present invention is to provide a novel and useful semiconductor memory testing device and testing method in which the above described problems have been overcome.

Another and more specific object of the present invention is to provide a semiconductor memory testing device and testing method in which the output of an address pattern generator is supplied to a fail memory device through an address swapping device. According to the testing devices and testing method of the present invention, access is made to the fail memory device by an address identical to that of the memory device being tested, and the information concerning the defective bits written-in upon either the normal mode or the swap mode can be used as it is during operational tests in either succeeding normal or swap modes.

Other objects and further features of the present invention will be apparent from the following detailed description when read in conjunction with the accompanying drawings.

DETAILED DESCRIPTION OF THE PREFERRED EMBODIMENT

Figure 1:
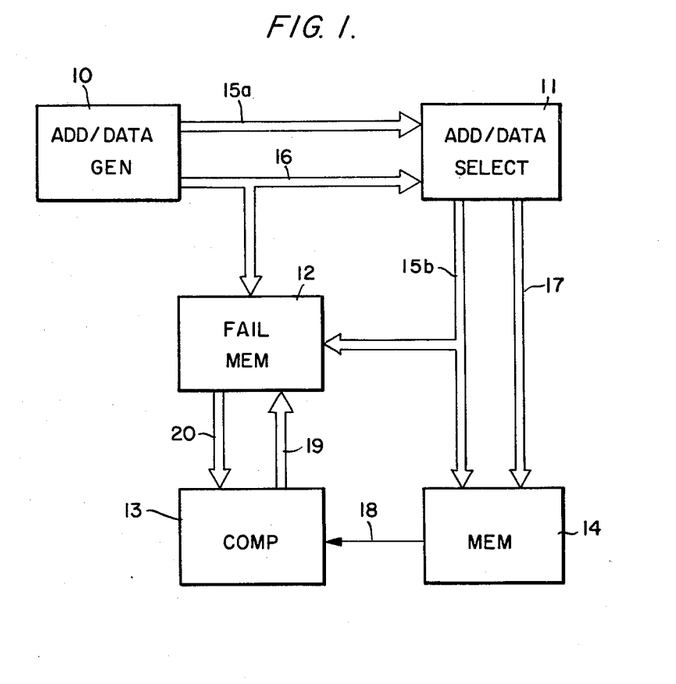
FIG. 1 is a simplified block diagram showing an embodiment of a semiconductor memory testing device using a testing method according to the present invention.

FIG. 1 is a simplified block diagram showing an embodiment of a semiconductor memory testing device using a testing method according to the present invention. In FIG. 1, an address pattern/data generator 10 also generates a test data pattern. Upon operation in any mode, an address pattern transmitted by an address bus 15a which is generated by the address pattern/data generator 10 is applied to an address/data selector 11, an on the other hand, a data specified by a data bus 16 is supplied to both the address/data selector 11 and a fail memory device 12. The above data specified by the data bus 16 is also supplied to a semiconductor memory device 14 which is to be tested, through the address-/data selector 11 by a data bus 17. An address specified by an address bus 15b is supplied to the fail memory device 12, from the address/data selector 11.

When a second data specified by a data bus 18 is read-out from the memory device 14, this read-out data is compared with an expected value by a comparator 13. Hence, when all the bits in the memory device 14 are normal, the data specified by the data bus 18 and the expected value are equal. However, when a defective bit memory cell exists, the defective bit is detected by the inequality of the data specified by the data bus 18 and the expected value. An output data specified by a data bus 19 which is supplied from the comparator 13, indicates the normal or defective state of all the bits within the memory device 14, and this information is stored into the fail memory device 12. As described above, the address of the fail memory device 12 is specified by the address specified by the address bus 15b which is supplied from the address/data selector 11. An inhibit signal or memory cell indicator 20 supplied from the fail memory device 12 controls the comparing operation performed by the comparator 13, and prohibits the comparison from being performed for the defective bits, that is, allows the defective bits to be masked.

Figure 2A:
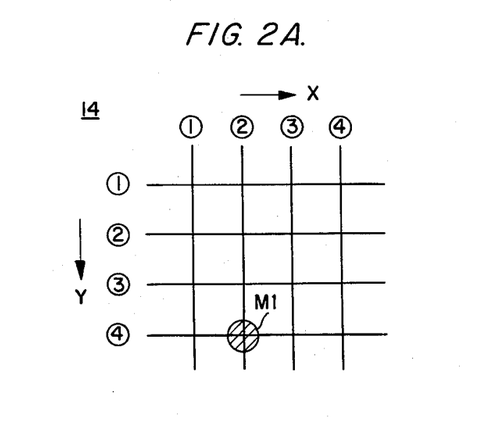
FIGS. 2A and 2B are diagrams respectively showing a defective bit, and are used for explaining the relationship between the address locations in a memory which is to be tested and a fail memory, during normal mode operation.
Figure 2B:
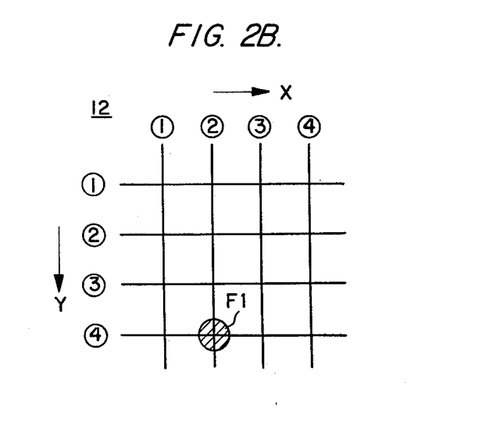

Upon normal mode operation, for example, the address pattern specified by the address bus 15a which is applied to the address/data selector 11, and the address specified by the address bus 15b which is supplied from the address/data selector 11, are the same address. Accordingly, the same address is supplied to both the fail memory device 12 and the memory device 14. Hence, when a defective bit M1 exists at an address X=2 and Y=4 of the memory device as shown in FIG. 2A, for example, the information concerning the defective bit M1 is written-in-to a bit F1 of the fail memory device 12 at the address X=2 and Y=4, as shown in FIG. 2B. Therefore, when the above defective bit M1 of the memory device 14 is selected, the bit F1 of the fail memory device is simultaneously selected. Thus, the content of the bit F1 is supplied to the comparator 13 as the inhibit signal 20 (memory celll indicator indicating that the bit is defective), and prohibits the comparison from being performed for the bit M1.

Figure 3A:
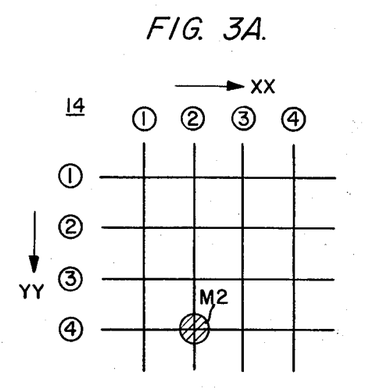
FIGS. 3A and 3B are diagrams respectively showing a defective bit, and are used for explaining the relationship between the address locations in the memory which is to be tested and the fail memory, during swap mode operation.
Figure 3B:
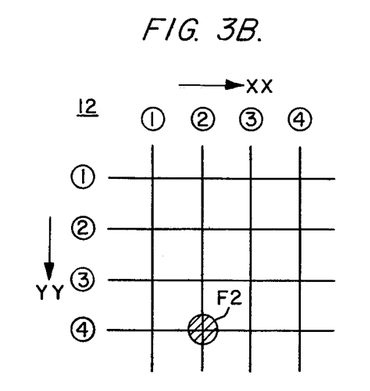

On the other hand, during swap mode operation, the address pattern specified by the address bus 15a and the address specified by the address bus 15b are not equal. That is, the X and Y addresses of the address specified by the address bus 15b comprises the interchanged X and Y addresses of the address pattern specified by the address bus 15a. However, this interchanged address, mainly, the address specified by the address bus 15b, is supplied to both the fail memory devide 12 and the memory device 14, as in the normal mode. In this case, the difference from the normal mode lies in the fact that the address supplied to both the fail memory device 12 and the memory device 14, is the address which is interchanged at the address/data selector 11. This application after the interchange of the address is shown by the diagrams of FIGS. 3A and 3B. FIG. 3A shows a bit M2 of a memory device in the swap mode at an address XX=2 and YY=4. FIG. 3B shows a bit F2 of a fail memory device in the swap mode, corresponding to the bit M2 of the above memory device, at an address XX=2 and YY=4. The rest of the operation is identical to that upon normal mode operation, and accordingly, when a defective bit exists, the defective bit can be correctly masked.

Figure 4:
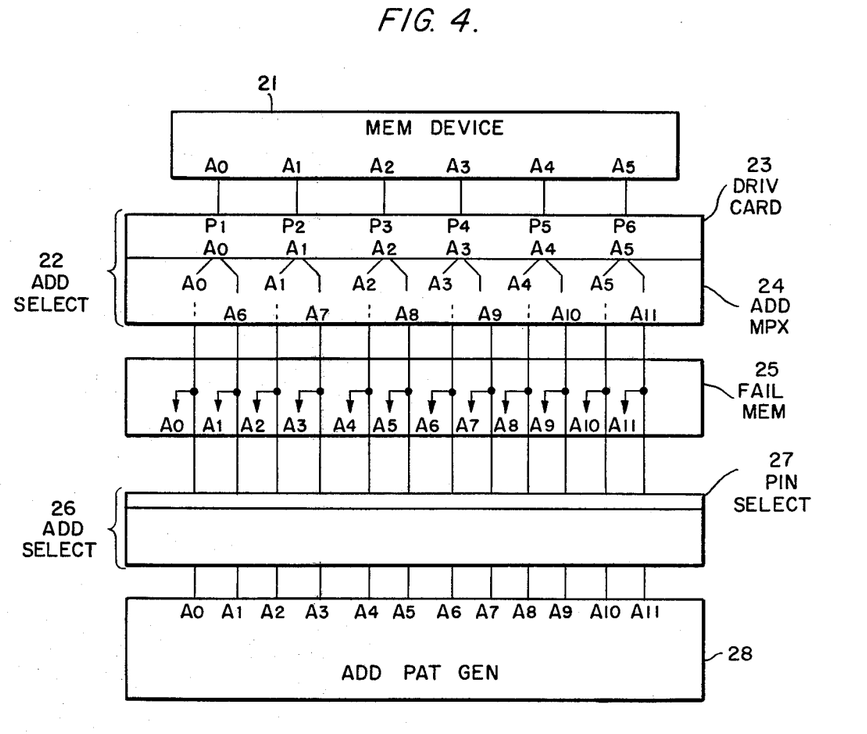
FIG. 4 is a block diagram showing the essential parts of the address system of FIG. 1.

FIG. 4 is a block diagram showing the essential parts of the address system of FIG. 1, in which the comparator 13 is not shown to simplify the diagram. Each of address selectors 22 and 26 comprises a pin selector 27, a drive card 23, an address multiplexer 24, and the like. In FIG. 4, P1 through P6 designate driver pins. A0 through A11 designate address bits; however, the contents of the address bits designated by the same symbol in the different stages are not necessarily the same. An address pattern generator is designated by the numeral 28.

Figure 5:
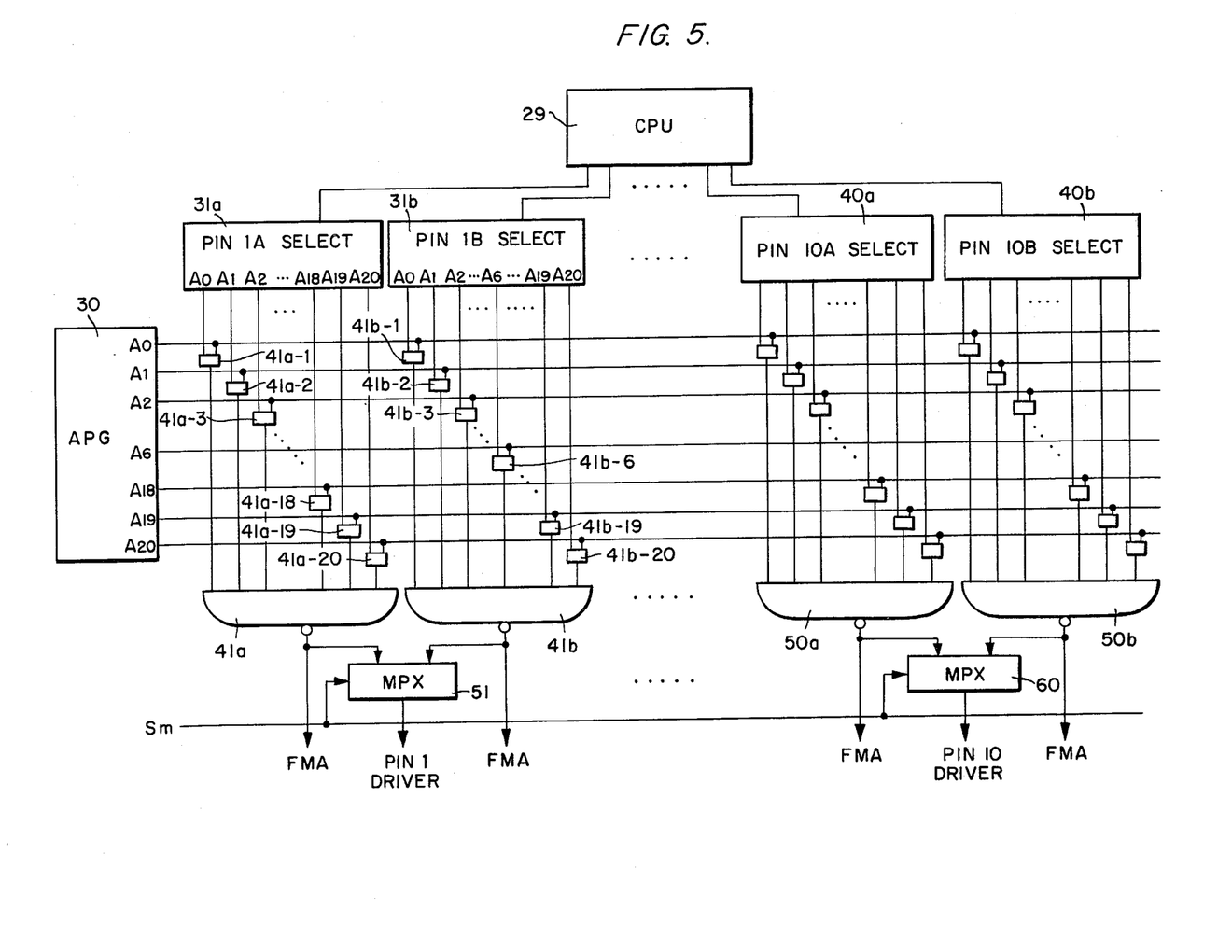
FIG. 5 is a detailed diagram showing the construction of the pin selector of FIG. 4.

The essential part of the above address selectors 22 and 26, is the pin selector 27, and a more detailed diagram showing the construction of the pin selector is illustrated in FIG. 5. The example shown in FIG. 5 is a case in which twenty-one address bits, mainly, A0 through A20 are used.

In FIG. 5, the pin selector comprises pin selecting circuit pairs 31a and 31b through 40a and 40b, a matrix part having NAND-gates 41a-1 through 41a-20, 41b-1 through 41b-20, - - - , and NAND-gates 41a through 50b which mix the output signals from the above matrix. Multiplexers 51 through 60 which multiplex the fail memory output addresses FMA supplied by NAND-gate pairs 41a and 41b through 50a and 50b, correspond to the address multiplexer 24 of FIG. 4. Accordingly, the multiplexers 51 through 60 are controlled by a multiplexing signal Sm and apply their output signals to driver pins P1 through P10 of the driver card 23 of FIG. 3. When the contents of the address bits A0 and A6 of the address pattern generator 28 of FIG. 4 are to be used for the driver pin P1, for example, the address bit A0 of the pin selecting circuit 31a is set at a high level, and the other address bits of that pin selecting circuit are set at low levels. Similarly, the address bit A6 of the pin selecting circuit 31b is set at a high level, and the other address bits of that pin selecting circuit are set at low levels.

Accordingly, the output levels of the NAND-gates excluding the NAND-gates 41a-1 and 41b-6 are forcibly set low, and the output signals of the NAND-gates 41a-1 and 41b-6 respectively become reversed in logic as compared to those of the address bits A0 and A6 of the address pattern generator 28. However, the NAND-gates at the output stage again reverse the logic of the above output signals, and therefore, the output fail memory addresses FMA of the NAND-gates 41a and 41b are the same phase as those of the outputs in the address bits A0 and A6 of the address pattern generator 28.

On the other hand, when address swapping is to be performed for the address bits A0 and A6, the address bit A6 of the pin selecting circuit 31a is set at a high level, and the other address bits of that pin selecting circuit are all set at low levels. Similarly, by setting the level of the address bit A0 of the pin selecting circuit 31b high, and setting the level of the other address bits of that pin selecting circuit low, the relationship between the address bits A0 and A6 becomes that of a swap mode. The above explanation is applicable to all the other address bits, thus, the output fail memory address FMA is used for accessing to both the memory device which is to be tested and the fail memory device.

As described above, the testing of a semiconductor memory device is simplified according to the semiconductor memory testing device and testing method of the present invention, since, after the defective bits are written-in to the fail memory device, the masking operation is not affected by the address swapping performed in the memory device which is to be tested.

Further, this invention is not limited to these embodiments but various variations and modifications may be made without departing from the scope of the invention.

What is claimed is:

1. A testing system for testing a semiconductor memory device, comprising:
   an address pattern generator which successively generates an address pattern of predetermined addresses, which specifies the address of each memory cell of said semiconductor memory device which is to be tested;
   an address swapping device, operatively connected to said address pattern generator and said semiconductor memory device and having normal and swap operation modes, for accessing said semiconductor memory device with said address pattern generated by said address pattern generator in the normal operation mode, and for accessing said semiconductor memory device with an address pattern generated from said address pattern generated by said address pattern generator in which the predetermined addresses in the address pattern are interchanged in the swap operation mode;
   a comparator, operatively connected to said semiconductor memory device, for comparing data read-out from said semiconductor memory device with an expected value to detect hardware error; and
   a fail memory device, operatively connected to said address pattern generator, said address swapping device and said comparator, for generating an inhibit signal and for storing information concerning the existence of hardware error in each of the memory cells of said semiconductor memory device obtained from said comparator into an address region corresponding to that of said semiconductor memory device, said semiconductor memory device and said fail memory device both receiving the same address pattern from said address swapping device part, and said comparator being prevented from comparing by the inhibit signal supplied by said fail memory device for the memory cells of said semiconductor memory device corresponding to the memory cells of said fail memory device which have information stored therein indicating the existence of hardware errors.

2. A testing system for testing a semiconductor memory device, comprising:
   an address pattern/data generator which successively generates an address pattern of predetermined addresses which specifies the address of each memory cell of said semiconductor memory device which is to be tested and having a first data;
   an address/data selector, operatively connected to said address pattern/data generator and said semiconductor memory device and having normal and swap operation modes, for accessing said semiconductor memory device with said address pattern generated by said address pattern/data generator in the normal operation mode, and for accessing said semiconductor memory device with an address pattern generated from said address pattern generated by said address pattern/data generator in which the predetermined addresses in the address pattern are interchanged in the swap operation mode, said address/data selector also passing there through the first data to said semiconductor memory device in any operation mode;
   a comparator, operatively connected to said semiconductor memory device, for comparing a second data read-out from said semiconductor memory device with an expected value to detect hardware error; and
   a fail memory device, operatively connected to said address pattern/data generator, said address/data selector and said comparator, for generating an inhibit signal, and for storing information concerning the existence of hardware error in each of the memory cells of said semiconductor memory device obtained from said comparator in an address region corresponding to that of said semiconductor memory device, said fail memory device also receiving the first data from said address pattern/data generator, said semiconductor memory device and said fail memory device both receiving the same address paattern from said address/data selector, and said comparator being prevented from comparing by the inhibit signal supplied by said fail memory device for the memory cells of said semiconductor memory device corresponding to the memory cells of said fail memory device which have information stored therein indicating the existence of hardware error.

3. A testing system as claimed in claim 1, wherein said testing system is operatively connected to receive a control signal and further comprises a central processing unit for generating a pin selection information signal, wherein said address swapping device comprises:

a pin select part, operatively connected to said central processing unit, for receiving the pin selection information signal generated by said central processing unit and for generating a pin select output signal;

an address multiplexer, operatively connected to said pin select part, for multiplexing the pin select output signal of said pin select part and for generating a multiplexed output signal; and a drive card, operatively connected to said address multiplexer, said fail memory device, said semiconductor memory device and to receive the control signal, for generating a drive output signal, said drive card being supplied with the multiplexed output signal from said address multiplexer and controlled in its operation by the control signal, said drive card supplying the drive output signal to both said fail memory device and said semiconductor memory device which is to be tested, so that the specific address of a memory cell in said semiconductor memory device is specified.

4. A testing system as claimed in claim 2, wherein said testing device is operatively connected to receive a control signal and further comprises a central processing unit for generating a pin selection information signal, wherein said address/data selector comprises:

a pin select part, operatively connected to said central processing unit, for receiving the pin selection information signal generated by said central processing unit and for generating a pin select output signal;

an address multiplexer, operatively connected to said pin select part, for multiplexing the output signal of said pin select part and for generating a multiplexed output signal; and a drive card, operatively connected to said address multiplexer and said fail memory, said semiconductor memory device and to receive the control signal, for generating a drive output signal, said drive card being supplied with the multiplexed output signal from said address multiplexer and controlled in its operation by the control signal, said drive card supplying its drive output signal to both said fail memory device and said semiconductor memory device which is to be tested, so that the specific address of a memory cell in said semiconductor memory device is specified.

5. A testing system as claimed in claim 3, wherein said pin select part comprises:

a plurality of pin selecting circuit pairs, operatively connected to said central processing unit, for respectively receiving said pin selection information signal generated by said central processing unit;

a plurality of matrix part pairs, operatively connected to said plurality of pin selecting circuit pairs, respectively, for respectively receiving the outputs of said pin selecting circuit pairs, each of said matrix part pairs comprising a plurality of first NAND-gates, operatively connected to said plurality of pin selecting pairs, respectively; and a plurality of second NAND-gate pairs, operatively connected to said plurality of first NAND-gate pairs, said semiconductor memory device and said fail memory device, for generating the drive output signal and for respectively mixing the output signal from said matrix part pairs, and supplying the drive output signals to both said semiconductor memory device and said fail memory device.

6. A testing system as claimed in claim 4 wherein said pin select part comprises:

a plurality of pin selecting circuit pairs, operatively connected to said central processing unit, for respectively receiving said pin selection information signal generated by said central processing unit a plurality of matrix part pairs, operatively connected to said plurality of pin selecting circuit pairs, for respectively receiving the outputs of said pin selecting circuit pairs, said matrix part pairs each comprising a plurality of first NAND-gates, operatively connected to said plurality of pin selecting circuit pairs, respectively, and;

a plurality of second NAND-gate pairs, operatively connected to said plurality of first NAND-gate pairs, respectively, said semiconductor memory device and said fail memory device, for generating the drive output signal and for respectively, mixing the output signal from said matrix part pairs, and supplying the drive output signals to both said semiconductor memory device and said fail memory device.

7. A method of testing a semiconductor memory device having memory cells and employing a failure storage memory having locations, an expected value of read data from the memory cells and a sequence of address data having elements, each element of the address data addressing one of the memory cells and having first and second parts, said method comprising the following steps:

performing cell defect tests on all of the memory cells, including:
generating one of the elements of the sequence of the address data;
applying the one of the elements to the semiconductor memory device and to the failure storage memory;
comparing the read data output of the semiconductor memory device with the expected value; and
responding to said comparison to store a memory cell indicator in the failure storage memory location addressed by the one of the elements, the memory cell indicator being a defective memory cell indicator whenever the read data output of the semiconductor memory device does not equal the expected value;

performing cell operational tests on all of said memory cells, including:
generating one of the elements of the sequence of the address data;
applying the one of the elements to the semiconductor memory device and to the failure storage memory having the memory cell indicators stored therein;
generating the inhibit signal if the location in the failure storage memory addressed by the one of the elements contains one of the defective memory cell indicators; and
performing at least one operational test on the semiconductor memory device if the inhibit signal is not generated;

performing said cell defect tests on all of the memory cells using a new sequence of address data in which the first and second parts in each of the elements are interchanged; and performing said cell operational tests on all of said memory cells using the new sequence of address data in which the first and second parts in each of the elements are interchanged.

8. A method of testing a semiconductor memory device having memory cells and employing a failure storage memory having locations, an expected value of read data and a sequence of address data having elements, each element of the address data addressing one of the memory cells and having first and second parts, said method comprising the following steps performed or each of the memory cells:

generating one of the elements of the sequence of address data;

applying the one of the elements to the semiconductor memory device to the failure storage memory;

comparing the output of the semiconductor memory device with the expected value;

responding to said comparison to store a memory cell indicator in the failure storage memory location addressed by one of the elements, the memory cell indicator being a defective memory cell indicator whenever the read data output from the semiconductor memory device does not equal the expected value;

generating an inhibit signal if the location in the failure storage memory addressed by the one of the elements contains one of the defective memory cell indicators;

performing at least one operational test on the semiconductor memory device if the inhibit signal is not generated;

interchanging said first and second parts of the one of the elements;

applying the one of the elements having the interchanged first and second parts to the semiconductor memory device and to the failure storage memory;

comparing the read out data from the semiconductor memory device with the expected value;

responding to said comparison to store the memory cell indicator in the failure storage memory location addressed by the one of the elements having the interchanged first and second parts;

generating the inhibit signal if the location in the failure storage memory addressed by the one of the elements having the interchanged first and second parts contains one of the defective memory cell indicators; and performing at least one operational test on the semiconductor memory device if the inhibit signal is not generated.

* * * * *

UNITED STATES PATENT AND TRADEMARK OFFICE
CERTIFICATE OF CORRECTION

PATENT NO. : 4,384,348

DATED : May 17, 1983

INVENTOR(S) : Shigeki Nozaki

It is certified that error appears in the above-identified patent and that said Letters Patent is hereby corrected as shown below:

Front page, [54], "METHOD FOR TESTING" should be --SYSTEM AND METHOD OF TESTING--;

[57], ABSTRACT, line 9, "and" should be --with--;

line 14, after "existence", insert --of--.

Column 1, line 47, delete "an".

Column 2, line 10, after "and", insert --the--;

delete "the";

line 21, before ""001000"", insert --and--;

line 65, after "is", insert --,--.

Column 3, line 34, "an" should be --and--;

line 48, after "bit", first occurrence, insert --or--.

Column 4, line 5, "in-to" should be --into--;

line 21, "mainly" should be --that is--;

line 22, "devide" should be --device--;

line 55, after "selector", insert --27 (Fig. 4)--;

UNITED STATES PATENT AND TRADEMARK OFFICE
CERTIFICATE OF CORRECTION

PATENT NO. : 4,384,348            Page 2 of 2

DATED : May 17, 1983

INVENTOR(S) : Shigeki Nozaki

It is certified that error appears in the above-identified patent and that said Letters Patent is hereby corrected as shown below:

line 57, delete "part";

line 67, "3" should be --4--.

Column 8, line 15, ", and;" should be --; and--.

Signed and Sealed this

*Thirteenth* Day of *March 1984*

[SEAL]

*Attest:*

GERALD J. MOSSINGHOFF

*Attesting Officer*          *Commissioner of Patents and Trademarks*